(12) United States Patent
Hellig et al.

(10) Patent No.: US 6,881,616 B1
(45) Date of Patent: Apr. 19, 2005

(54) SYSTEM FOR FORMING A SEMICONDUCTOR DEVICE AND METHOD THEREOF INCLUDING IMPLANTING THROUGH A L SHAPED SPACER TO FORM SOURCE AND DRAIN REGIONS

(75) Inventors: Kay Hellig, Austin, TX (US); Douglas J. Bonser, Austin, TX (US); Wen-Jie Qi, Austin, TX (US)

(73) Assignee: Advanced Micro Devices, Inc., Sunnyvale, CA (US)

(*) Notice: Subject to any disclaimer, the term of this patent is extended or adjusted under 35 U.S.C. 154(b) by 124 days.

(21) Appl. No.: 10/058,854

(22) Filed: Jan. 28, 2002

Related U.S. Application Data
(60) Provisional application No. 60/340,554, filed on Dec. 14, 2001.

(51) Int. Cl.[7] .............................................. H01L 21/338
(52) U.S. Cl. ........................ 438/181; 438/184; 438/185
(58) Field of Search ................................ 438/181, 187, 438/185

(56) References Cited

U.S. PATENT DOCUMENTS

| | | | |
|---|---|---|---|
| 5,576,230 A | * 11/1996 | Guldi | 438/198 |
| 5,679,589 A | * 10/1997 | Lee et al. | 438/305 |
| 6,074,915 A | * 6/2000 | Chen et al. | 438/258 |
| 6,096,657 A | 8/2000 | Beckx et al. | |
| 6,156,598 A | * 12/2000 | Zhou et al. | 438/231 |
| 6,162,692 A | 12/2000 | Gardner et al. | 438/301 |
| 6,180,988 B1 | 1/2001 | Wu | 257/419 |
| 6,277,683 B1 | 8/2001 | Pradeep et al. | 438/280 |
| 6,346,468 B1 | 2/2002 | Pradeep et al. | |
| 6,376,262 B1 | 4/2002 | Kempa et al. | |
| 6,380,039 B1 | 4/2002 | Badenes et al. | |
| 6,391,732 B1 | 5/2002 | Gupta et al. | |
| 6,440,875 B1 | 8/2002 | Chan et al. | 438/778 |
| 6,492,280 B1 | 12/2002 | DeOrnellas et al. | |
| 6,506,650 B1 | 1/2003 | Yu | 438/301 |

OTHER PUBLICATIONS

U.S. Appl. No. 10/058,708, Hellig et al., pending.
U.S. Appl. No. 10/058,852, Hellig et al., pending.

* cited by examiner

*Primary Examiner*—W. David Coleman
*Assistant Examiner*—William M. Brewster
(74) *Attorney, Agent, or Firm*—Toler, Larson & Abel, LLP

(57) ABSTRACT

A method for fabricating sidewall spacers in the manufacture of an integrated circuit device is disclosed. A dielectric spacer layer is formed over the semiconductor substrate. The dielectric spacer layer is etched prior to forming a layer subsequent to the dielectric layer, to form an L-shaped spacer. In another embodiment, a structure is formed on a substrate, the structure having a sidewall portion that is substantially orthogonal to a surface of the substrate. A dielectric layer is formed over the substrate. A spacer is formed over a portion of the dielectric layer and adjacent to the sidewall portion of the structure, wherein at least a portion of the dielectric layer over the substrate without an overlying oxide spacer is an unprotected portion of the dielectric. At least a part of the unprotected portion of the dielectric layer is removed. An intermediate source-drain region can be formed beneath a portion of the L-shaped spacer by controlling the thickness and/or the source drain doping levels.

9 Claims, 18 Drawing Sheets

SYSTEM FOR FORMING A SEMICONDUCTOR DEVICE AND METHOD THEREOF INCLUDING IMPLANTING THROUGH A L SHAPED SPACER TO FORM SOURCE AND DRAIN REGIONS

PRIORITY APPLICATION

This patent application claims benefit under 35 U.S.C. 119(e) of the U.S. Provisional application No. 60/340,554 filed on Dec. 14, 2001, entitled: "SYSTEM FOR FORMING A SEMICONDUCTOR DEVICE AND METHOD THEREOF."

CO-PENDING APPLICATIONS

This application is related to U.S. patent application Ser. No. 10/058,852 entitled "SYSTEM FOR FORMING A SEMICONDUCTOR DEVICE AND METHOD THEREOF", filed on Jan. 28, 2002, and U.S. patent application Ser. No. 10/058,708 entitled "SYSTEM FOR FORMING A SEMICONDUCTOR DEVICE AND METHOD THEREOF" filed on Jan. 28, 2002.

FIELD OF THE DISCLOSURE

The present disclosure relates generally to the manufacture of semiconductor devices, and more particularly to the formation of source drain regions in semiconductor devices having side wall spacers.

BACKGROUND OF INVENTION

An integrated circuit (IC) is an assembly of discrete devices such as resistors, transistors, capacitors, etc. As an example, the transistor is a device comprising on-off properties that act as a power switch to the IC. A commonly known transistor to those skilled in the art is a metal-oxide-semiconductor field effect transistor (MOSFET).

Generally speaking, a typical MOSFET comprises a silicon substrate with a thin layer of thermally grown oxide used to isolate the substrate from conductive electrode. The metal electrode, generally referred to as a gate electrode, controls the on-off properties of the working device. The substrate including the gate electrode further comprises an oxidized gate dielectric layer on the sidewalls of the gate electrode and low-doped drain regions formed by implanting ions into the substrate of both sides of the gate dielectric layer. A spacer of an insulating layer is generally formed adjacent to opposite sidewalls of the gate electrode and the oxidized gate dielectric layer. An ion implantation process is performed to form a source and a drain at predetermined positions of the substrate besides the at least two spacers.

A conventional spacer commonly known to those skilled in the art is a D-shaped spacer. As the semiconductor industry continues to increase the density of devices manufacturable on a semiconductor substrate, the device features continue to shrink below the quarter-micron size. The critical dimensions between the gate electrodes are decreased, making it more difficult to achieve void-free fill between the spacers adjacent to the gate electrodes. In addition, channel stress-related and silicide stress-related problems increase with decreasing dimension. It is desired to fabricate semiconductor devices using reliable processing methods including a reduction in the number of steps required to fabricate a semiconductor device, reduced defects, lower thermal budget, reduced channel stress, and reduced resistivity at the source/drain region.

The disclosed invention provides space methods of forming this spacer, and more specifically a method of forming a spacer.

Figure 1:
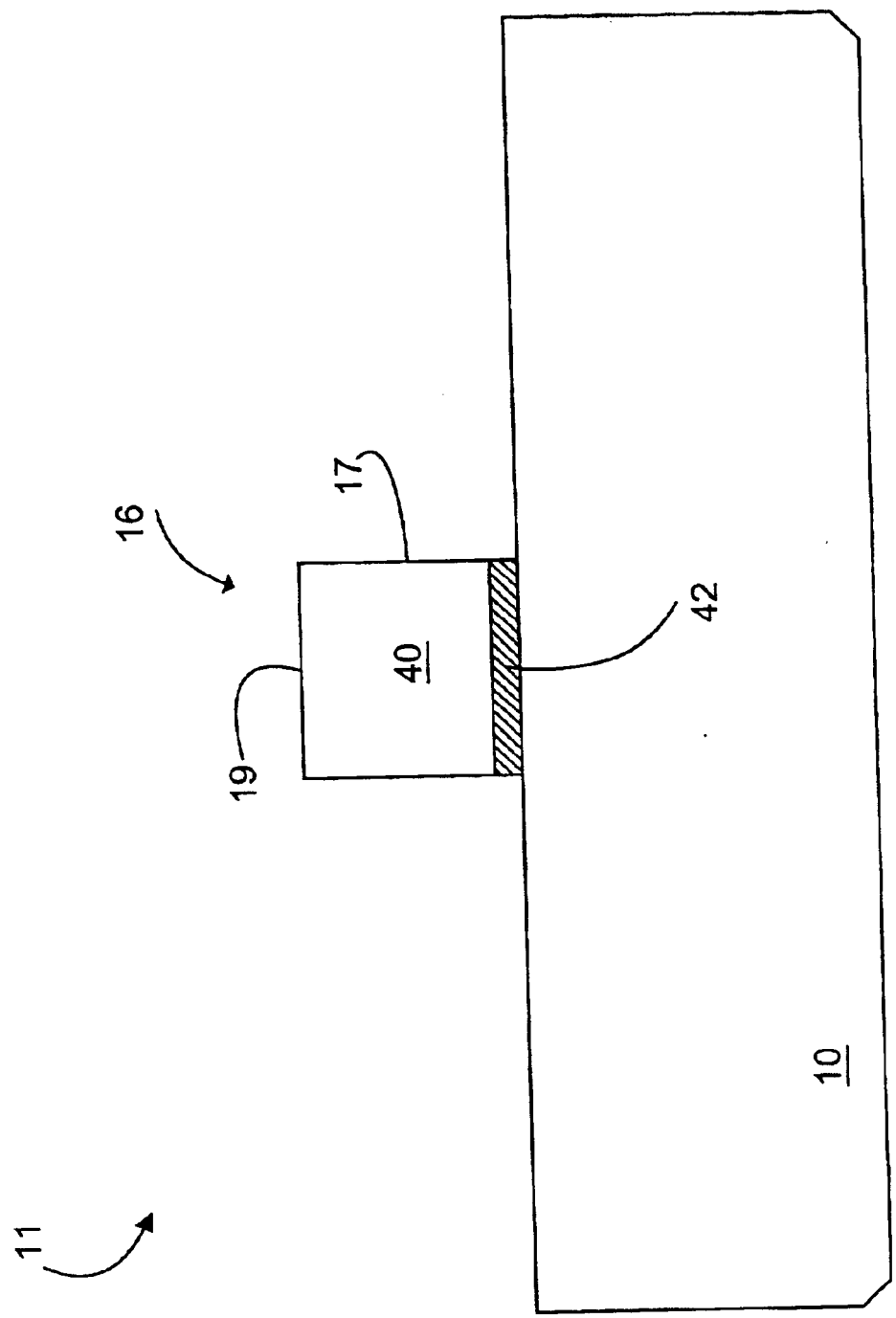
FIGS. 1–18 illustrate cross-sectional views of sequential phases of a method associated with forming a device in accordance with a specific embodiment of the present invention.

It will be appreciated that for simplicity and clarity of illustration, elements illustrated in the Figures have not necessarily been drawn to scale. For example, the dimensions of some of the elements are exaggerated relative to other elements for clarity. Further, where considered appropriate, reference numerals have been repeated among the figures to indicate corresponding or analogous elements.

DETAILED DESCRIPTION OF THE DRAWINGS

FIGS. 1 through 18 depict, in accordance with various embodiments of the disclosures made herein, the formation of a semiconductor device with a self aligned spacer, and a method of forming such a self aligned spacer during manufacture of a semiconductor device. The method provides for improved thermal budget, reduced channel stress, and reduced resistivity at the source/drain region.

FIG. 1 is a cross-sectional view illustrating an exemplary embodiment of a portion of a semiconductor device 11. The device of FIG. 1 includes a substrate 10. In the assorted embodiments, substrate 10 is a semiconductor device substrate such as silicon, gallium arsenide, or other appropriate substrate, on which the illustrated features have been formed. For reference purposes, substrate 10 is illustrated as having a horizontal surface. A structure 16 is formed on the substrate 10, wherein the structure 16 comprises a sidewall portion 17 that is substantially orthogonal to the surface of the substrate 10, and a top portion 19 that is substantially parallel to the surface of the substrate 10. In a more specific embodiment, the structure 16 is a gate structure comprising a gate electrode 40 overlying a gate dielectric layer 42, which forms the sidewall portion 17. In an embodiment, the gate electrode 40 is a polysilicon conductor and the gate dielectric layer 42 is an oxide layer, such as silicon dioxide, hafnium oxide, or a hafniumsilicate compound. In another embodiment, the gate electrode 40 comprises a layer containing at least one of a heavy metal or oxygen atoms, or other suitable gate material known to those of skill in the art. By way of example, the heavy metal atoms include Ruthenium or Indium. More specifically, the gate electrode 40 can comprise Ruthenium oxide or Iridium oxide.

Figure 2:
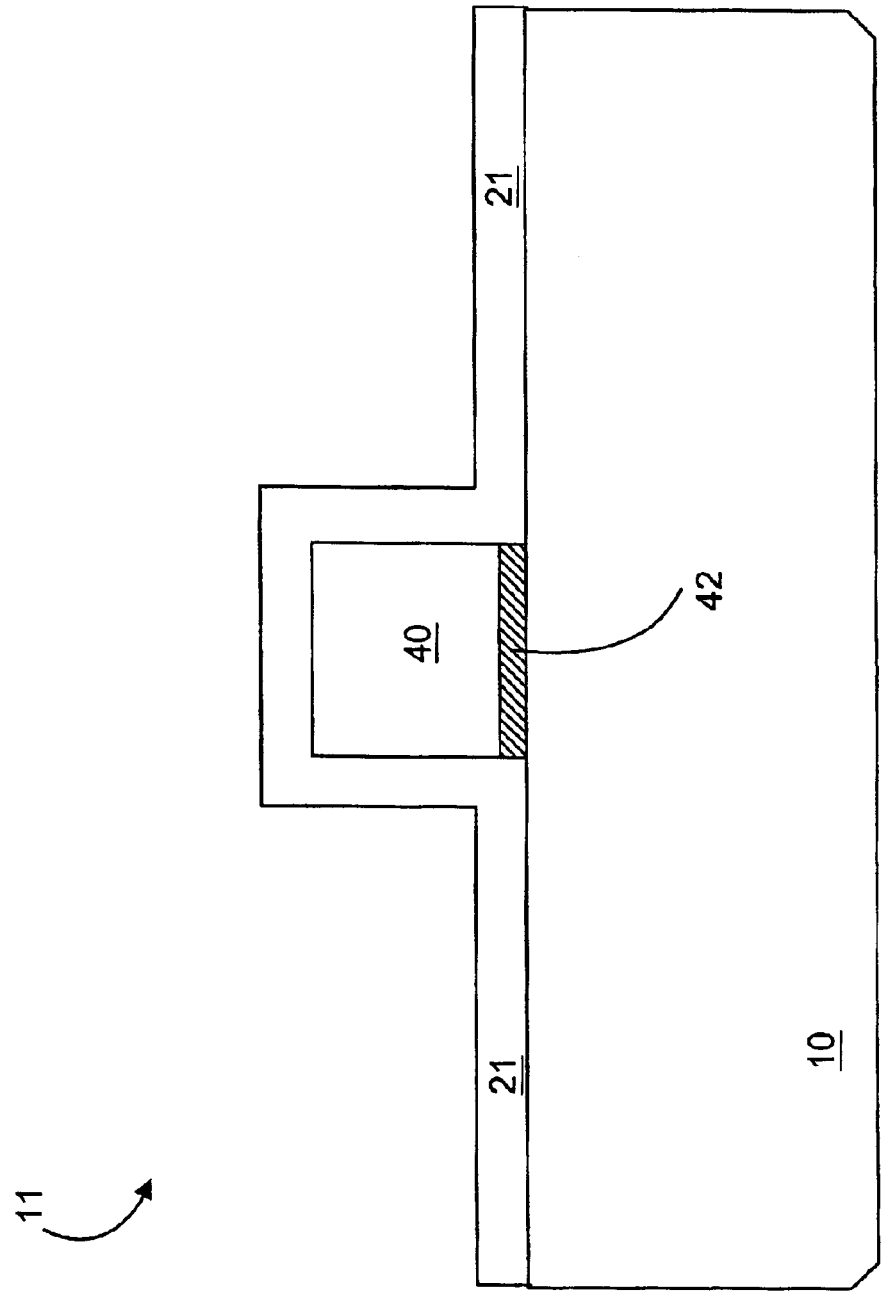

FIG. 2 is a cross-sectional view illustrating a liner oxide layer 21 formed over the substrate 10 and gate electrode 40 of semiconductor device 11 according to an embodiment of the present disclosure. Liner oxide layer 21 may be formed using low-pressure chemical vapor deposition (LPCVD) or plasma enhanced chemical vapor desposition (PECVD) techniques, and ranges in thickness from about 50 to 300 angstroms. In one embodiment, the thickness of liner oxide layer 21 ranges from about 60 to 200 angstroms.

Figure 3:
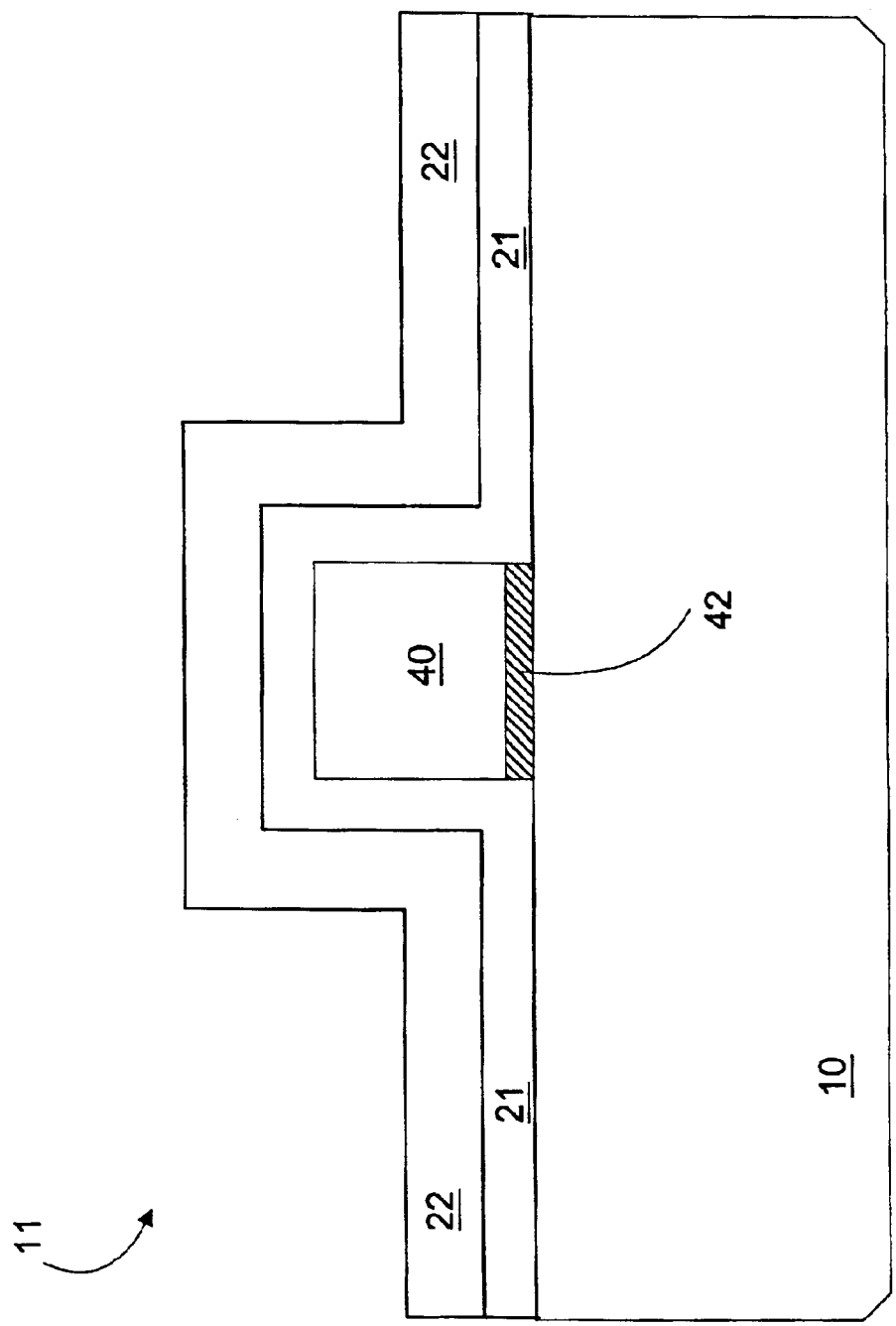

FIG. 3 is a cross-sectional view illustrating a dielectric layer 22 formed over the liner oxide layer 21 of semiconductor device 11. In an embodiment, the dielectric layer 22 is a nitride layer ranging in thickness from about 150 to 500 angstroms. In an exemplary embodiment, the thickness of dielectric layer 22 ranges from about 150 to 350 angstroms, and may be formed using LPCVD or PECVD techniques. Further, precursors for the nitride deposition include silane, dichlorosilane, hexachlorosilane, or BTBAS.

Figure 4:
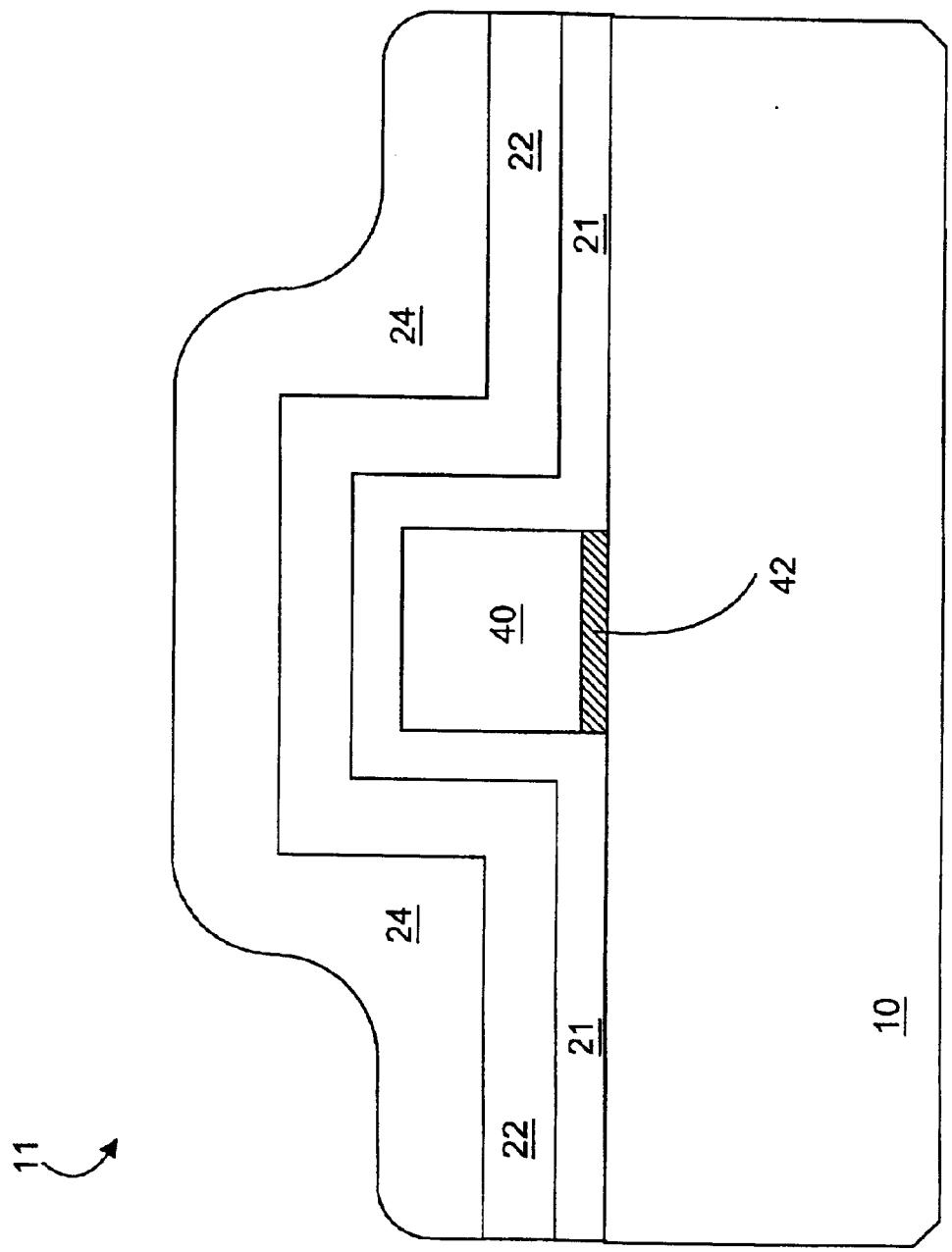
Figure 5:
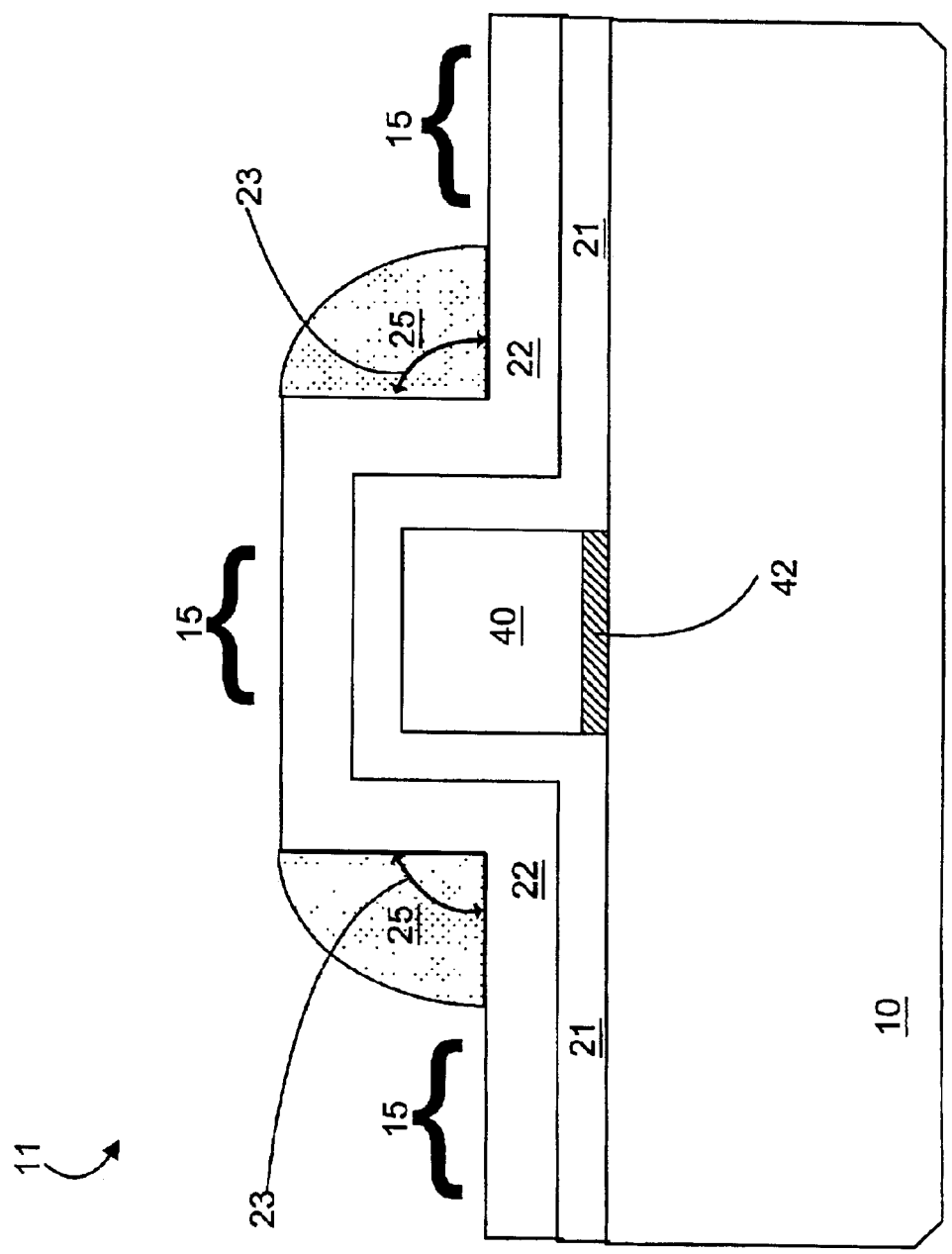

FIG. 4 is a cross-sectional view illustrating formation of an additional layer 24 over the semiconductor device 11 according to at least one embodiment of the present disclosure. In one embodiment, additional layer 24 may be comprised of an oxide layer ranging in thickness from about 500 to 1000 angstroms. For example, the oxide layer can include silicon dioxide. In another embodiment, additional layer 24 may be a silicon-containing layer ranging in thickness from about 300 to 900 angstroms. For example, the silicon-containing additional layer 24 can include polysilicon or amorphous silicon. Additional layer 24 serves the purpose of being sacrificial to the degree required to shape a forming spacer, as seen in FIG. 5. FIGS. 5 through 10 reference forming spacers made from an oxide additional layer 24, while FIGS. 11, 12, and 15 through 18 reference forming spacers made from a silicon-containing additional layer 24.

FIG. 5 illustrates a cross-sectional view showing the forming spacers 25 adjacent to the sidewall portion of structure 16 including the gate electrode 40 that remain after etching away portions of additional layer 24. In one embodiment, the forming spacers 25 are oxide portions that substantially fill an interior angle space 23 defined by the horizontal and vertical portions of the dielectric layer 22. Portions 15 of the dielectric layer 22 which do not have an overlying forming spacer 25, are referred to as unprotected portions 15 of the dielectric layer 22. For this particular embodiment, a process to etch away portion of additional layer 24 to form spacers 25 is a process selective to nitride that includes using $C_4F_8$ as a main etch gas and is commonly known to those skilled in the art. In another embodiment, the forming spacers 25 are silicon-containing portions that substantially fills an interior angle space 23 defined by the horizontal and vertical position of the dielectric layer 22. For this case, the silicon-containing forming spacers 25 can be sacrificial portions that are removed after its purpose has been served. In particular, the silicon-containing portions are removed using a process that includes HBr, $Cl_2$, and $HeO_2$ and is also commonly known to those skilled in the art.

Figure 6:
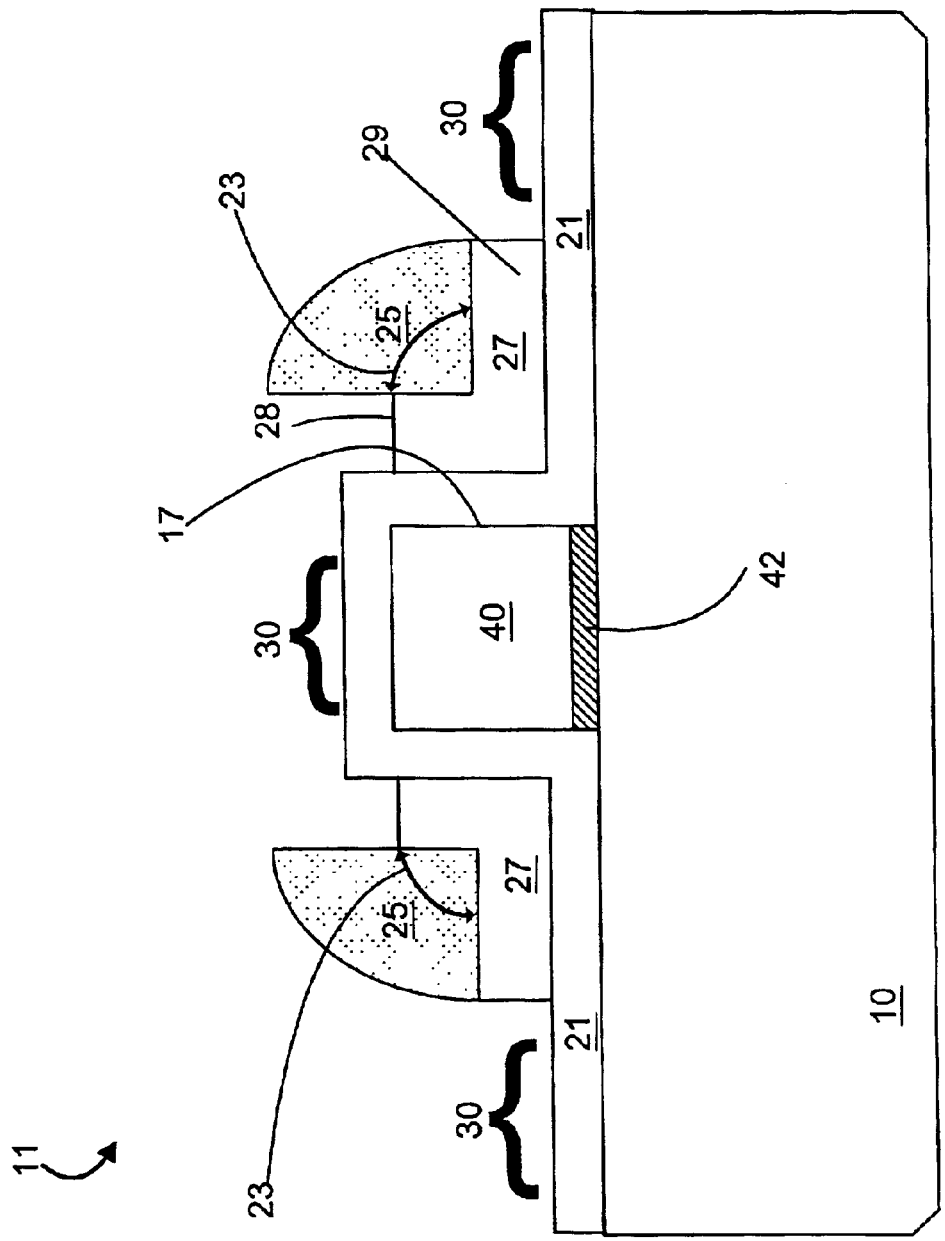

FIG. 6 is a cross-sectional view illustrating the semiconductor device 11, wherein at least part of the unprotected portions 15 (FIG. 5) of the dielectric layer 22 are removed to form at least one spacer 27. In one embodiment, the spacer 27 is an L-shaped spacer 27 having a sidewall portion 28 and a substrate portion 29. More specifically, the sidewall portion 28 of the spacer 27 is a vertical portion parallel to the sidewall portion 17 of structure 16 (FIG. 1) including the gate electrode 40. Further, the substrate portion 29 of the spacer 27 is a horizontal portion approximately orthogonal to the sidewall portion 17 of structure 16 including the gate electrode 40 and is substantially parallel to the original surface of the substrate 10. Portions 30 of liner oxide layer 21 that do not have an overlying L-shaped spacer 27 are referred to as unprotected portions 30 of the liner oxide layer 21. In one embodiment, the sidewall portion 28 of the L-shaped spacer 27 may be recessed as shown in FIG. 6.

By way of example, the distance between the uppermost section of the sidewall portion 28 and the upper surface of the gate electrode 40 range from about 200 to 300 angstroms. The recessed L-shaped spacer 27 enhances silicide growth in the following fabrication sequence. It should be noted that although forming spacer 25 is illustrated in FIG. 6 as extending above the uppermost section of sidewall portion 28 of L-shaped spacer 27, in other embodiments, forming spacer 25 may be on the same level as, or recessed slightly below, the uppermost section of sidewall portion 28 of L-shaped spacer 27. Final size of forming spacer 25 is dependent upon the extent of etch conducted upon it.

In the described embodiments, the etch process for removing at least part of the unprotected portions 15 of the dielectric layer 22 can utilize a dry etch process. In the assorted embodiments, the etch process involves the substrate 10 to be placed in an exemplary process chamber capable of performing a dry, anisotropic etch. The chamber can be a capacitively coupled chamber or an inductively coupled chamber. In one embodiment, the process steps of forming the forming spacer 25 by removing portions of additional layer 24 and the process steps of forming the L-shaped spacer 27 by removing at least part of the unprotected portions 15 of the dielectric layer 22 are executed in one process chamber. In another embodiment, the process steps of forming the forming spacer 25 and the L-shaped spacer 27 are performed in at least two different process chambers.

The chamber is pressurized to a value that enhances a uniform etch and the substrate 10 is adjusted to a temperature such as about 10 C to 30 C. In the case in which the dielectric layer 22 is a nitride layer, the resulting L-shaped spacer 27 comprises a nitride layer. A fluorine gas source and an oxygen gas source then flows a fluorine-containing gas mixture, which may optionally include an oxygen-containing gas mixture, into the pressurized chamber. The gas flow rate ratio may vary depending on the particular embodiment and the desired selectivity for a particular application.

In one embodiment, a process selective to both oxide and silicon layers includes using $CH_3F$ and $O_2$. The gas mixture comprising $CH_3F$ and $O_2$ flows into the chamber with a gas flow rate ratio having a value within the range of approximately 1:2 and 1:6, with a preferred range of 1:2 and 1:3. For this particular case, the chamber is pressurized to a value within the range of approximately 20 and 250 milli Torr (mTorr) and, more specifically, 60 to 100 mTorr.

In another embodiment, the use of an oxygen gas source is optional. By way of example, a process that is sufficiently selective to an oxide and silicon layer comprises $CF_4$, and $CHF_3$. The gas flow rate ratio of $CF_4$ and $CHF_3$ is a value within the range of approximately 1:0 and 0:1 and the chamber is pressurized to a value within the range of approximately 50 and 250 mTorr. Alternatively, a process selective to an oxide layer but not a silicon layer includes using $CF_4$ and HBr. For this case, the substrate 10 is adjusted to a temperature such as about 50 C to 80 C. The gas flow rate ratio of $CF_4$ and HBr is a value within the range of approximately 5:1 and 2:1 and the chamber is pressurized to a value within the range of approximately 50 and 150 mTorr.

After a sufficient time for the pressure and gas flow to stabilize, an excitation power is applied to sustain plasma for a sufficient period of time needed to etch away the unprotected area of a layer, such as the unprotected portion 15 of the dielectric layer 22 shown in FIG. 5. In one embodiment, an RF source power generator (not shown) coupled to an inductive antenna coils provides power to generate reactive species and controls the plasma density, which, in turn, enhances chemical reactions. An RF bias power generator controls the ion bombardment of the surface of device 11, and enhances a more physical etch. In another embodiment, only a single RF power generator is used and the etching mechanism may be either reactive or physical.

The period of time in which the excitation power sustains plasma needed to etch away the unprotected area of the dielectric layer 22 varies depending on the thickness of the dielectric layer 22. By way of example, the dielectric layer 22 is a nitride layer. More specifically, the dielectric layer 22 is a nitride layer having a thickness within the range of 150 and 500 angstroms. For this particular case, the etch rate is a value within the range of 300 and 900 angstroms per minute and, therefore, the excitation power is sustained at a value within the range of approximately 10 and 100 seconds.

Figure 7:
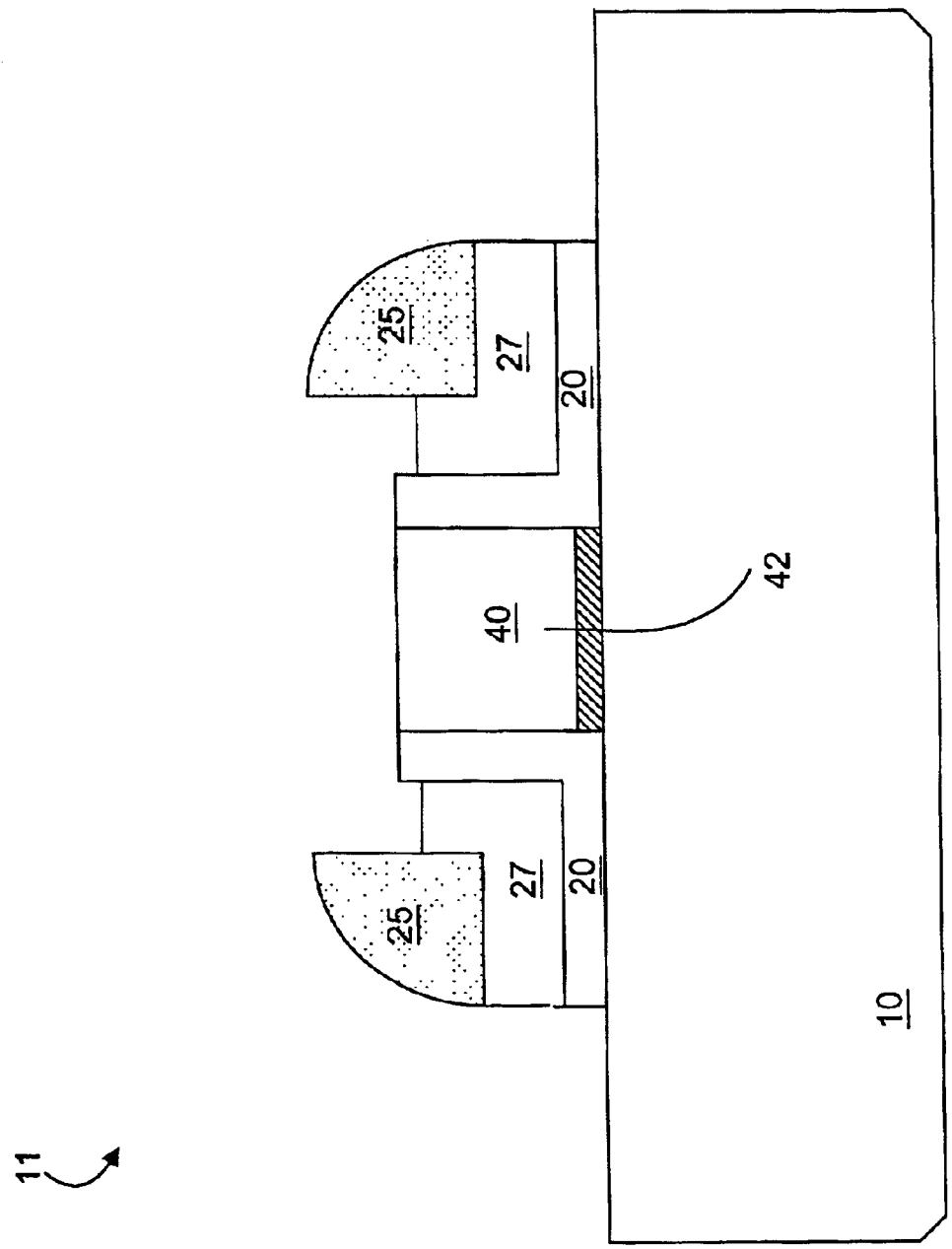

In one embodiment, unprotected portions 30 of liner oxide layer 21 may be etched such that only the protected portion 20 remains, as seen in FIG. 7. FIG. 7 is a cross-sectional view of the portion of a transistor of semiconductor device 11 after etching away the unprotected portions 30 of the liner oxide 21. The protected portion 20 of liner oxide layer 21 that remains is also L-shaped.

Figure 8:
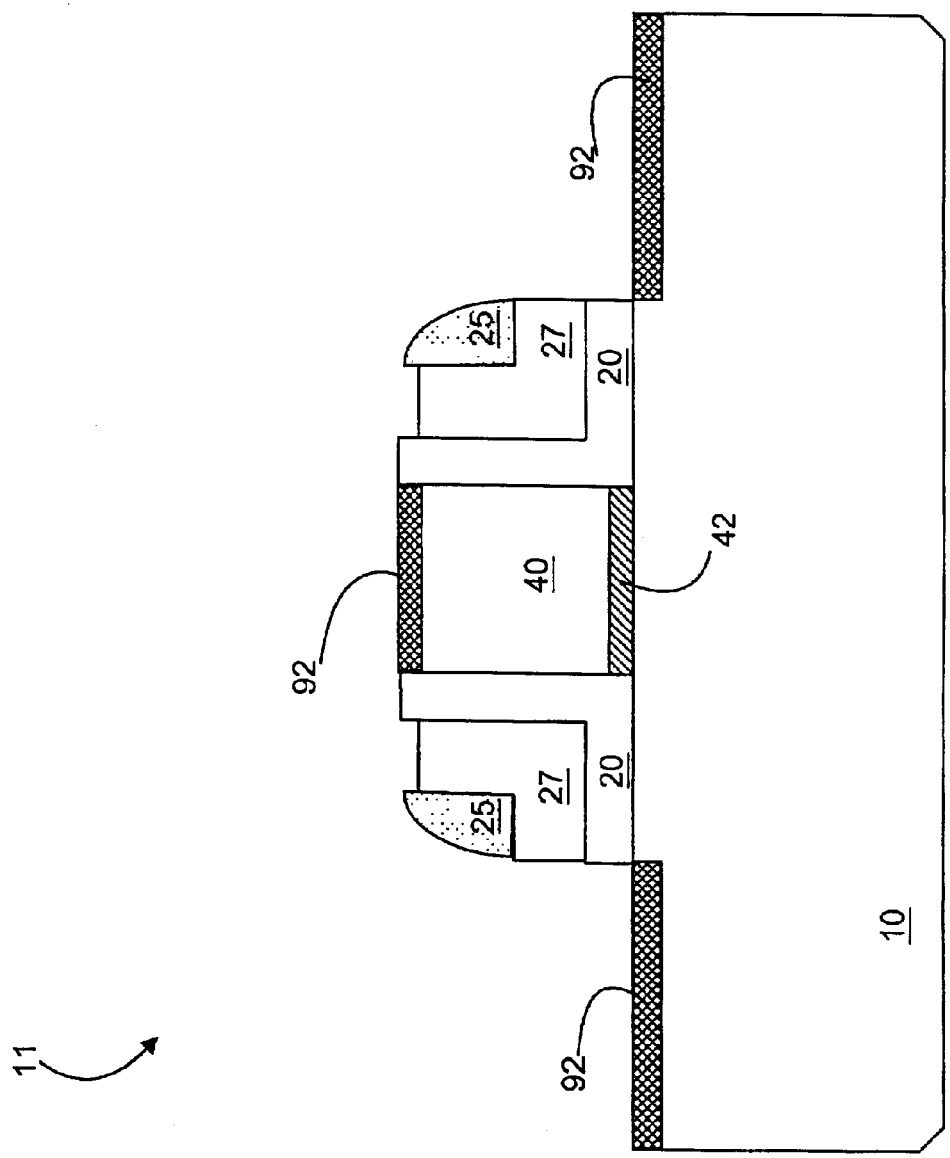

In the various embodiments, a metal layer such as one of titanium, cobalt, nickel, or similar group metals may be formed over the device 11 of FIG. 8, including over the forming spacer 25, L-shaped spacer 27, remaining portion of liner oxide 20, and the top of gate electrode 40. Annealing the device 11 of FIG. 8 at an elevated temperature causes the metal layer to react with the underlying surfaces of substrate 10 and the polysilicon gate electrode 40 during a silicidation process. More specifically, the heat reaction with the metal layer and the silicon present in substrate 10 and gate electrode 40, form silicide layers 92, illustrated by cross-section in FIG. 8. It should be noted that the remaining metal layer, which does not react at elevated temperature, is removed and is thus not illustrated in FIG. 8.

Figure 9:
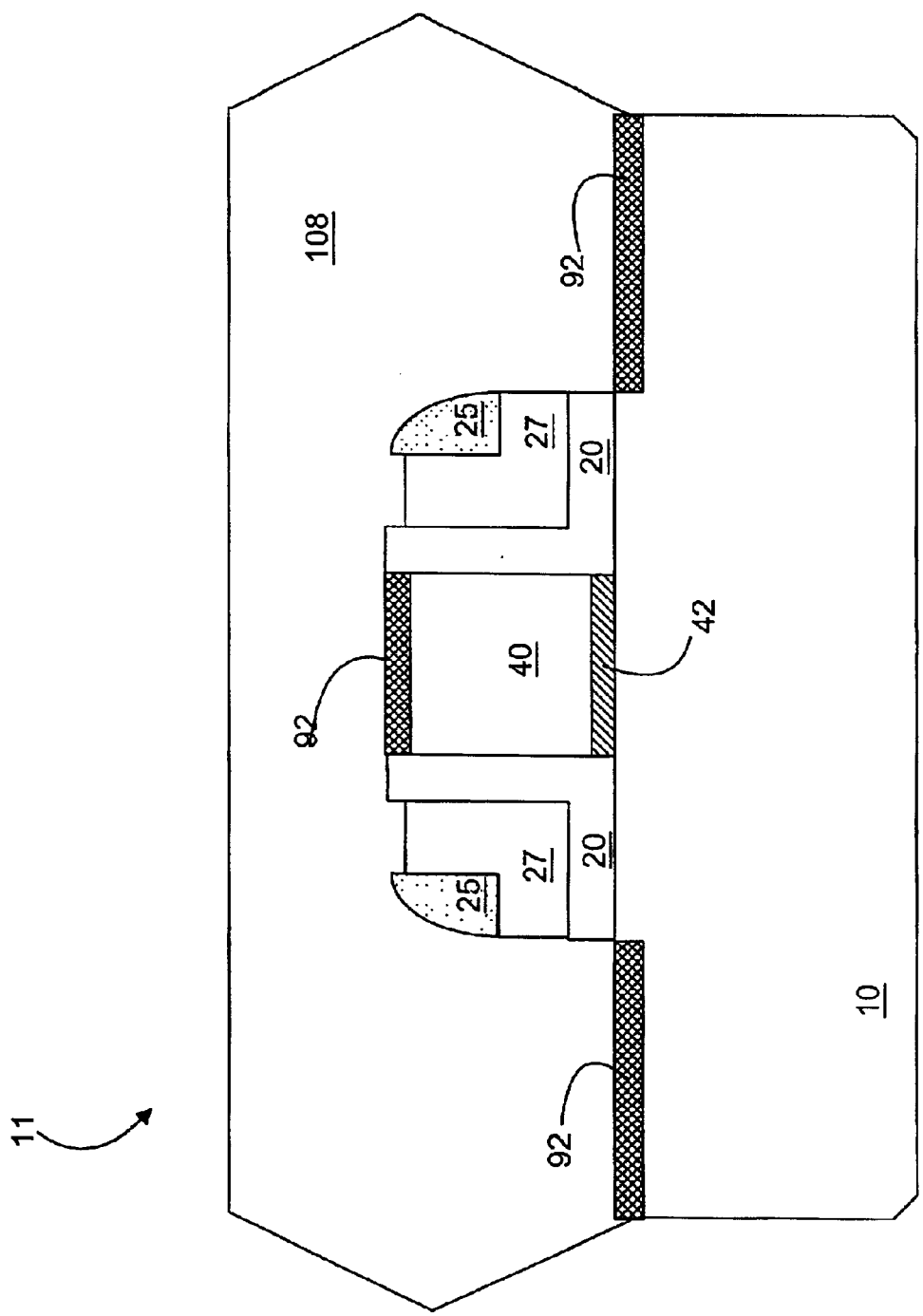

FIG. 9 illustrates a cross-sectional view of device 11 further including the addition of a pre-metal dielectric layer 108. In one embodiment, the pre-metal dielectric layer 108 includes at least one of an oxide layer, a boron silicon glass (BSG) layer, a boron phosphorous silicon glass (BPSG) layer or a phosphorous silicon glass (PSG) layer. Pre-metal dielectric layer 108 is formed over the device 11 of FIG. 8 to accommodate a subsequent metal layer (not illustrated). It should be noted that device 11 of FIG. 9 is a transistor, however, the formation of source/drain regions is not illustrated in FIG. 9.

Figure 10:
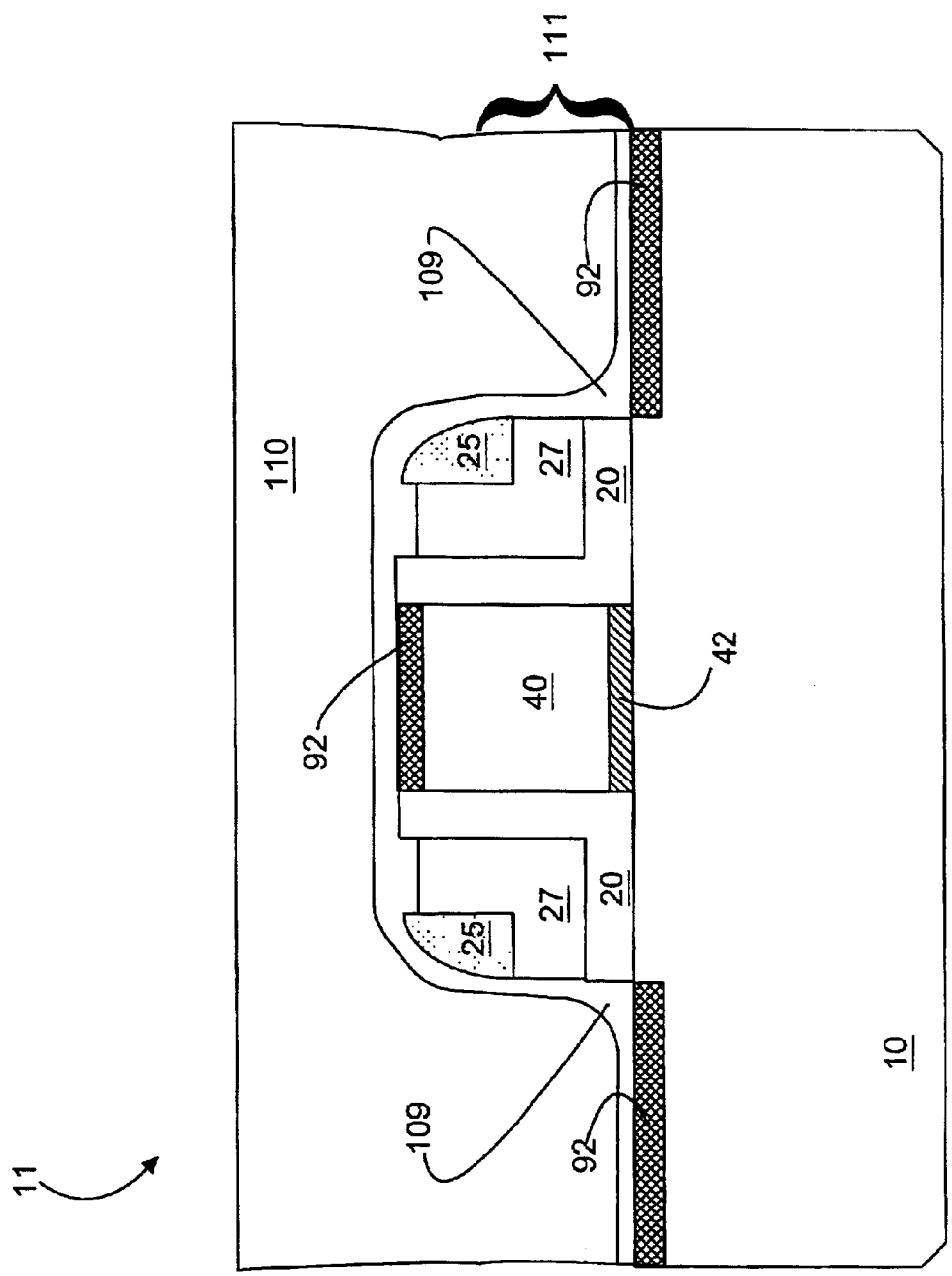

In an alternate embodiment of the present disclosure, the pre-metal dielectric layer 108 comprises a composite layer 111 including a first layer containing nitrogen 109 and a second layer 110, as illustrated in the cross-sectional view of FIG. 10. In particular, the first layer 109 of the composite layer 111 is between the forming spacer 25 overlying the spacer 27 and the second layer 110. By way of example, the first layer 109 is a silicon nitride layer or a siliconoxynitride layer. The second layer 10 comprises at least one of an oxide layer, a boron silicon glass (BSG) layer, a boron phosphorous silicon glass (BPSG) layer or a phosphorous silicon glass (PSG) layer.

Figure 11:
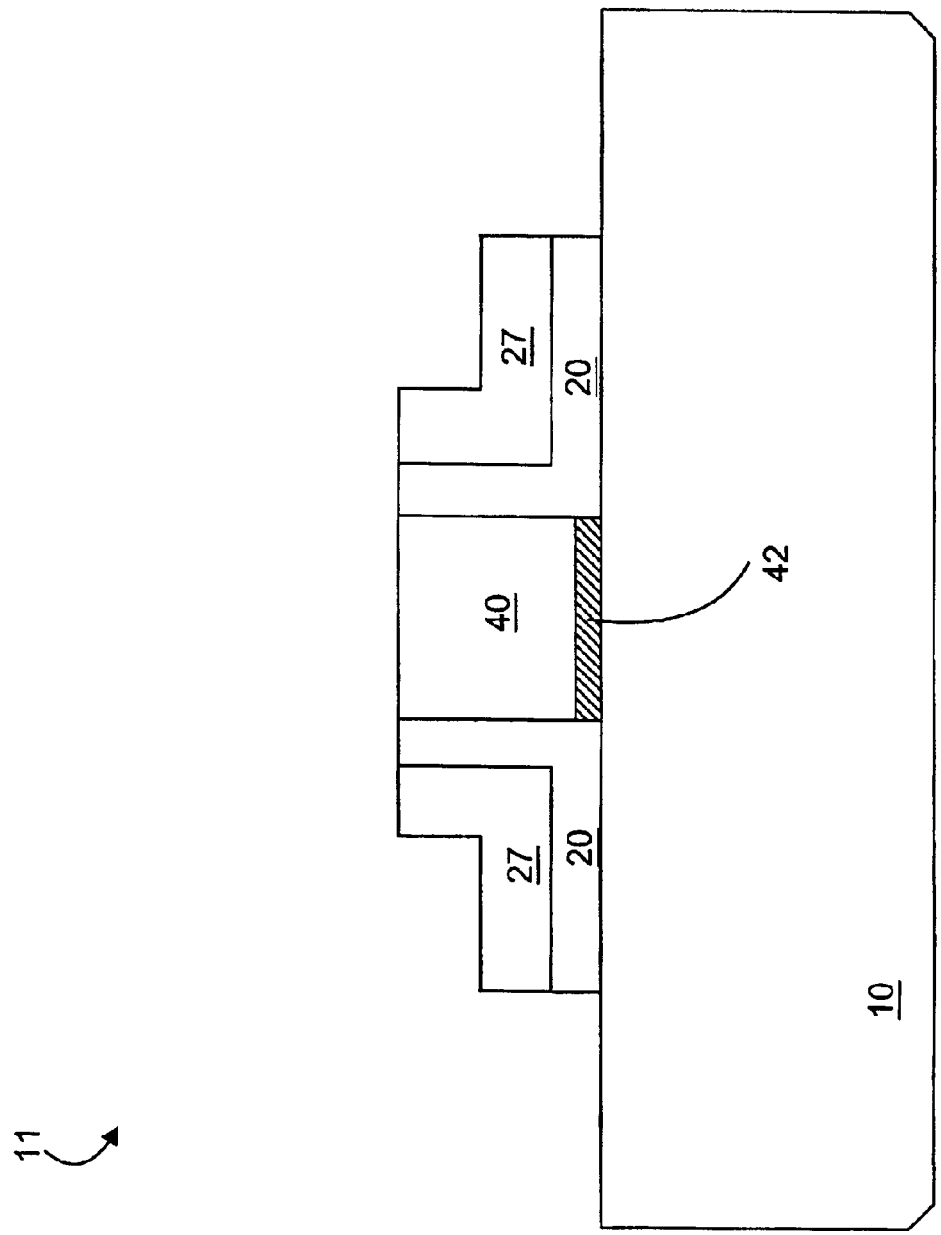

FIG. 11 is a cross-section view illustrating a partially formed transistor of semiconductor device 11 according to an embodiment of the disclosure. In the illustrated embodiment of FIG. 11, the various processing steps up to the formation of the L-shaped spacer 27 and remaining portion of liner oxide 20 have been completed, as was presented in FIGS. 4 through 7. Additionally, in FIG. 11, removal of the forming spacer (item 25 in FIGS. 5 through 7) which substantially filled an interior angle space defined by the horizontal and vertical position of the spacer 27 has been accomplished. For this particular embodiment, the forming spacer was a silicon-containing forming spacer. An exemplary technique for removing the (silicon or oxide) forming spacer includes reactive ion etching (RIE) dry etching.

Figure 12:
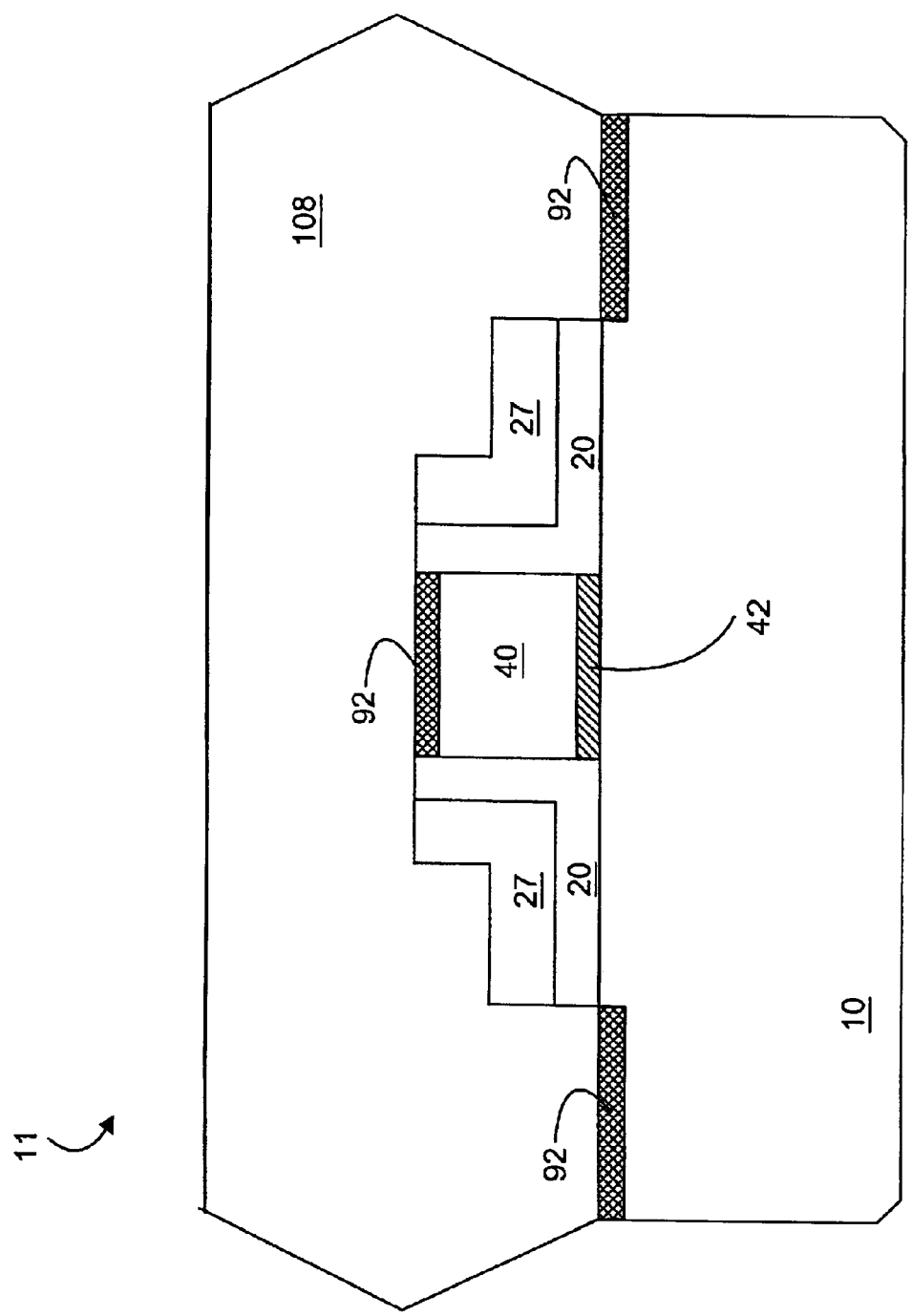

FIG. 12 illustrates a cross-sectional view of the semiconductor device of FIG. 11 having a silicide and pre-metal dielectric layer formed in a similar manner as discussed with reference to FIGS. 8 and 9. Alternately, the pre-metal dielectric layer may comprise a composite layer such as was discussed with reference to FIG. 10, including a first layer containing nitrogen, and a second layer.

Figure 13:
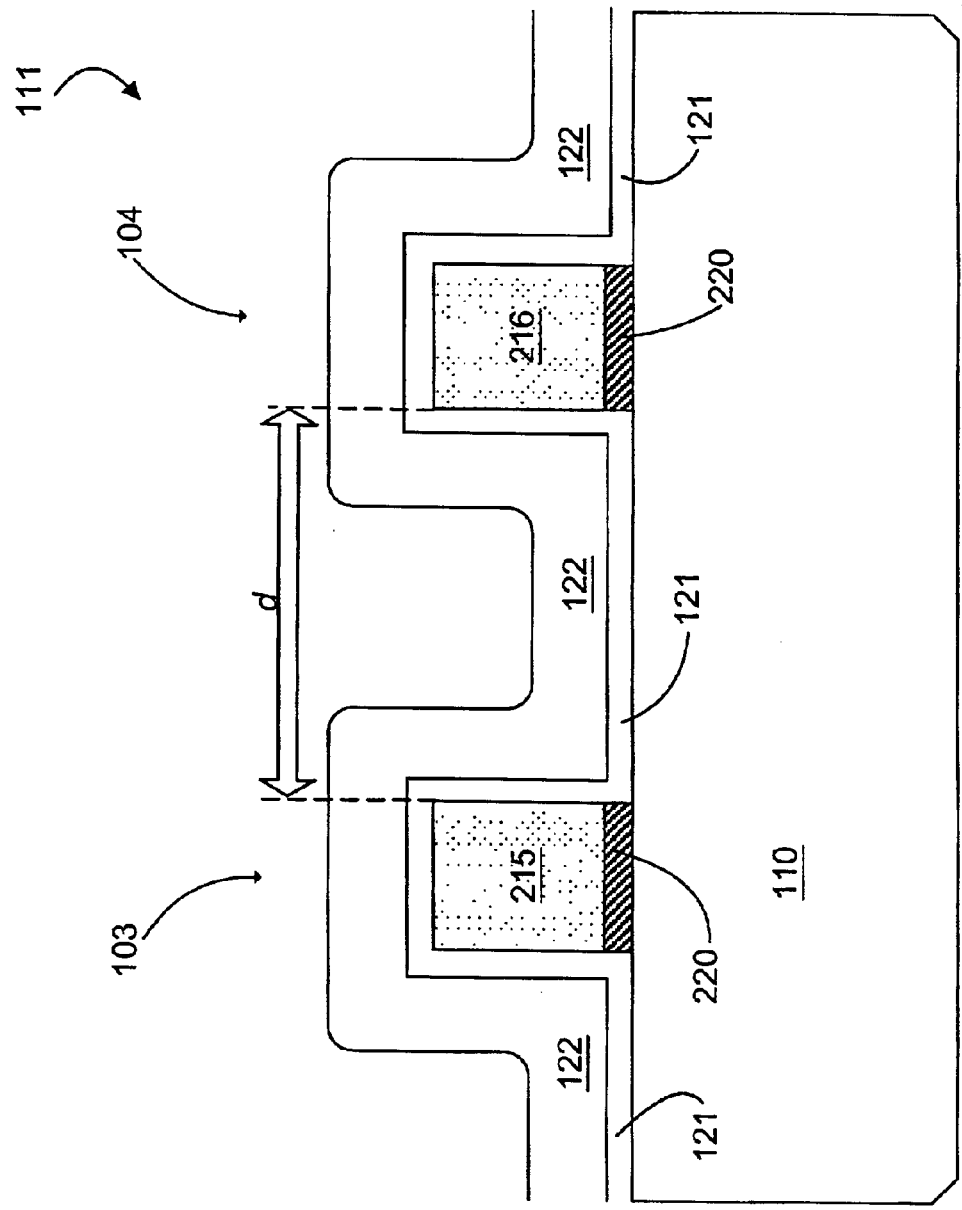

Referring now to FIG. 13, a cross-sectional view of a semiconductor device according to at least one embodiment of the present invention is presented. In this particular embodiment, semiconductor device 111 comprises two partially formed transistors 103 and 104. The distance of separation between the gate sidewalls of partially formed transistors 103 and 104 is denoted by the letter d, and in one embodiment is less than 150 nanometers, with a preferred distance being at or less that 120 nanometers.

Device 111 comprises a substrate 110, a first gate structure 215 and a second gate structure 216 formed on the substrate 110, at least one gate dielectric layer 220, a liner oxide layer 121 and a spacer dielectric layer 122 which has been formed overlying liner oxide layer 121. Substrate 110 may be active silicon or field isolation material. There is no oxide or silicon-containing forming spacer utilized in this particular embodiment.

Figure 14:
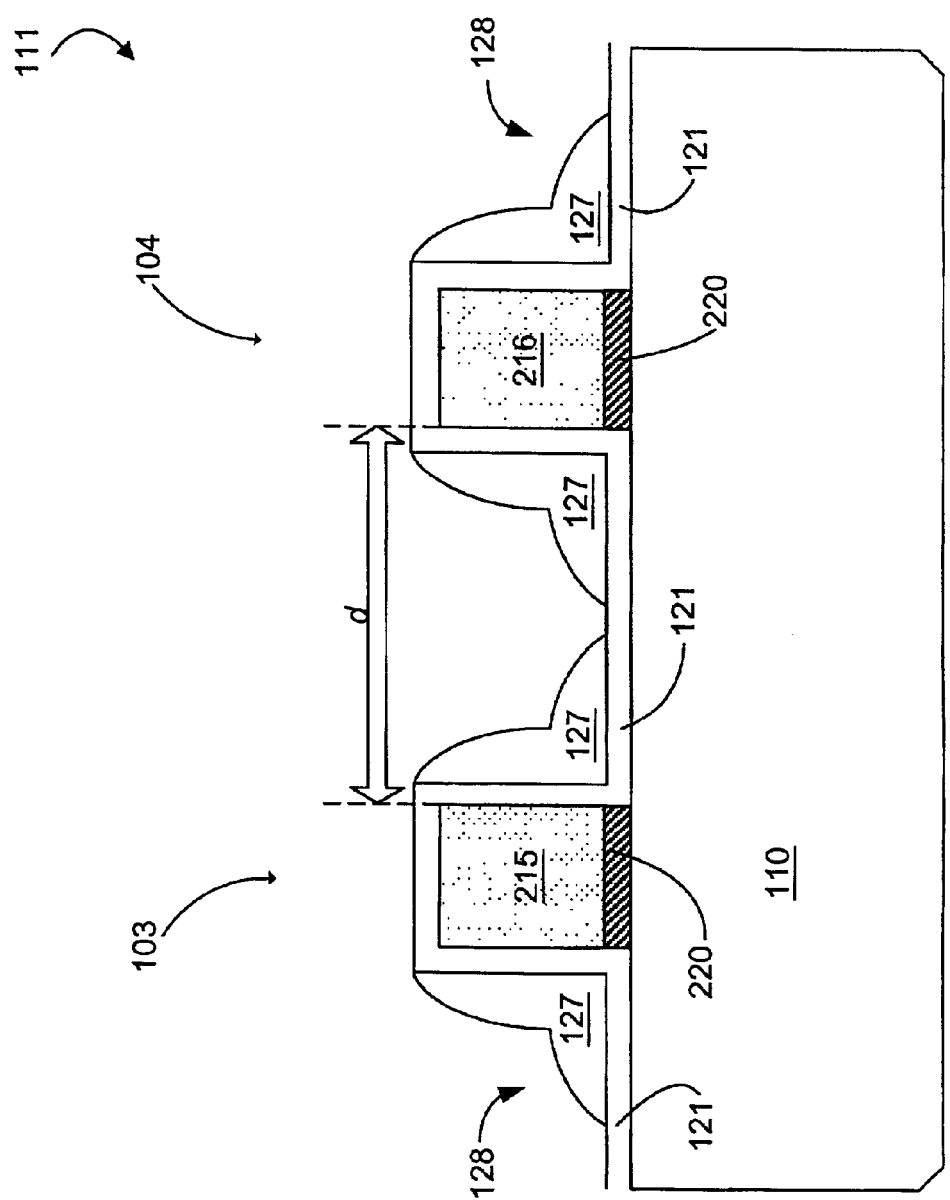

The spacer dielectric layer 122 is selectively etched to form an L-shaped spacer 127 as shown in the cross-sectional illustration of FIG. 14. In one embodiment, spacer dielectric layer 122 is a nitride layer. More specifically, the spacer dielectric layer 122 can be a nitride layer having a thickness within the range of approximately 150 and 500 angstroms. Similar to the dielectric layer 22 of FIG. 5, the spacer dielectric layer 122 can be formed using an PECVD or LPCVD technique. The underlying liner oxide 121, when used, would generally have a thickness in the range of approximately 20 angstroms to 200 angstroms.

For this particular embodiment, the process for forming the L-shaped spacer 127 from the dielectric layer 122 can utilize a dry etch process. The etch process involves the substrate 110 to be placed in an exemplary chamber capable of performing a dry, anisotropic etch. For example, the chamber can be a capacitively coupled chamber or an inductively coupled chamber. The chamber is pressurized to a value that enhances a uniform etch and the substrate 110 is adjusted to a temperature such as about 10 C to 30 C.

A fluorine gas source and an oxygen gas source then flows a fluorine-containing gas mixture and an oxygen-containing gas mixture into the pressurized chamber. The gas flow rate ratio may vary depending on the particular embodiment and the desired selectivity for a particular application. By way of example, the gas mixture comprises $CH_3F$ and $O_2$. The $CH_3F$ and $O_2$ gas mixture flows into the chamber with a gas flow rate ratio ($CH_3F:O_2$) having a value within the range of approximately 2:1 and 5:1, with a preferred range of 3:1 and 4:1. For this particular case, the chamber is pressurized to a value within the range of approximately 20 and 500 mTorr and, more specifically, 60 to 100 mTorr.

In the described embodiment, the $CH_3F$-rich gas mixture allows the L-shaped spacer 127 to be formed without employing the use of a sacrificial forming spacer. Variations and different embodiments of the L-shaped spacer 27 of FIG. 9 are applicable in the L-shaped spacer 127. In addition, the resulting benefits from the L-shaped spacer 27 of FIG. 9 are applicable to the L-shaped spacer 127. Examples of resulting benefits include a reduction in the number of steps required to fabricate a semiconductor device, reduced defects, lower thermal budget, reduced channel stress, and reduced resistivity at the source/drain region. The process used to form spacer 127 can reduce the number of steps used in the formation of the L-shaped spacers. The resulting spacer 127 has a bulging, which, with respect to the horizontal portion 128 of the spacer 127, results in a profile which varies gradually in thickness from a maximum thickness immediately adjacent the vertical portion of the L-shaped spacer to a portion of the L-shaped spacer furthest from the vertical-portion of the L-shaped spacer. The resulting profile of the horizontal portion of the spacer 127 varies gradually to provide for an average thickness of that is 50 to 85 percent of the maximum thickness, and, more specifically, 60 to 75 percent of the maximum thickness. In addition, one embodiment results in the formation of the horizontal portion 128 having a length that is between 80 and 150 percent of the deposition thickness of the layer 122 from which the spacers are formed.

Figure 15:
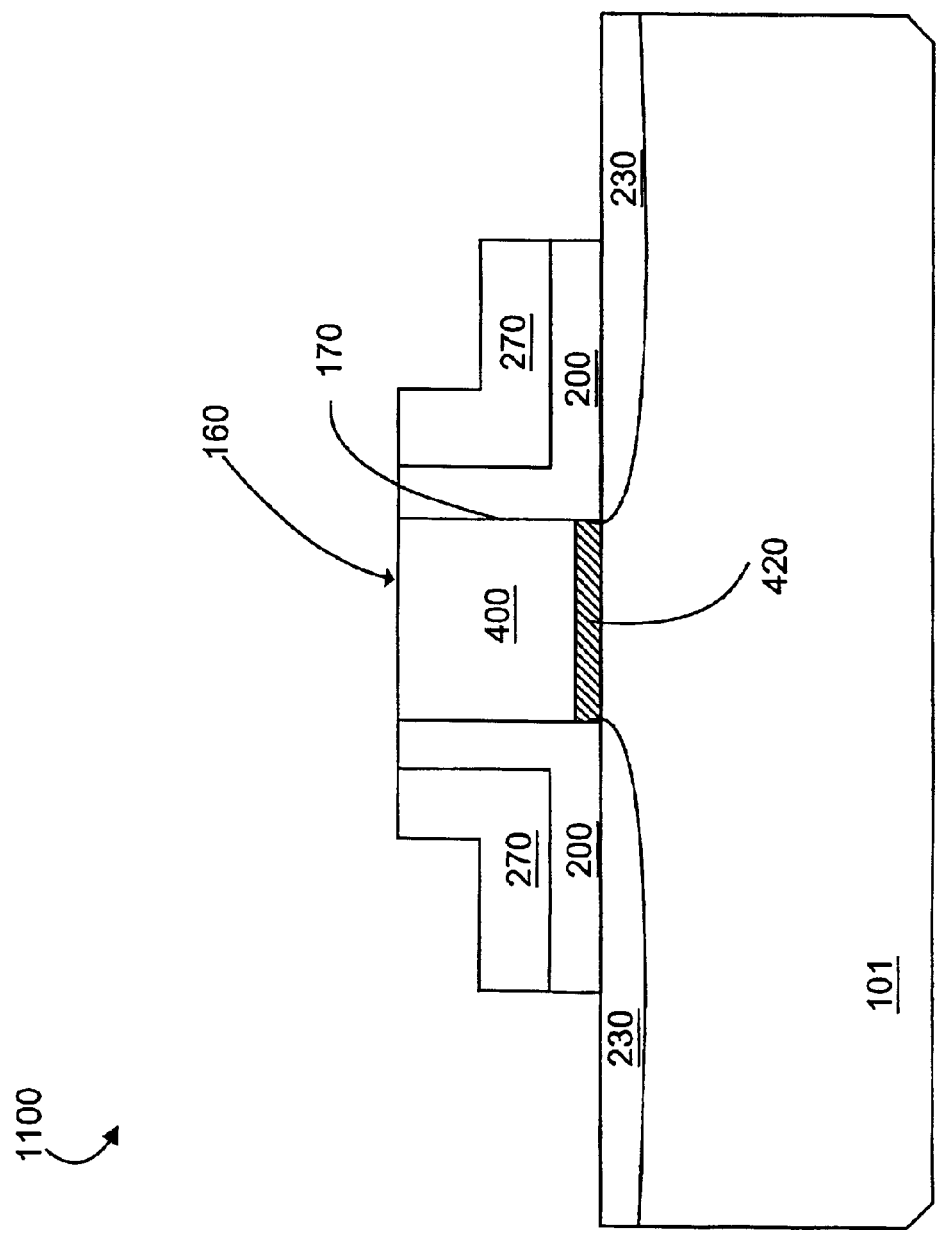

FIG. 15 illustrates a cross-sectional view of a partial transistor 1100 having a lightly doped source/drain region 230 (also referred to as a source/drain extension) in a substrate 101. Partial transistor 1100 is formed in the same manner as the partial transistor 11 illustrated in FIG. 11. Although not illustrated in FIG. 15, it is possible to have various halo implants underlying doped regions 230 in order to control short channel effects.

Figure 16:
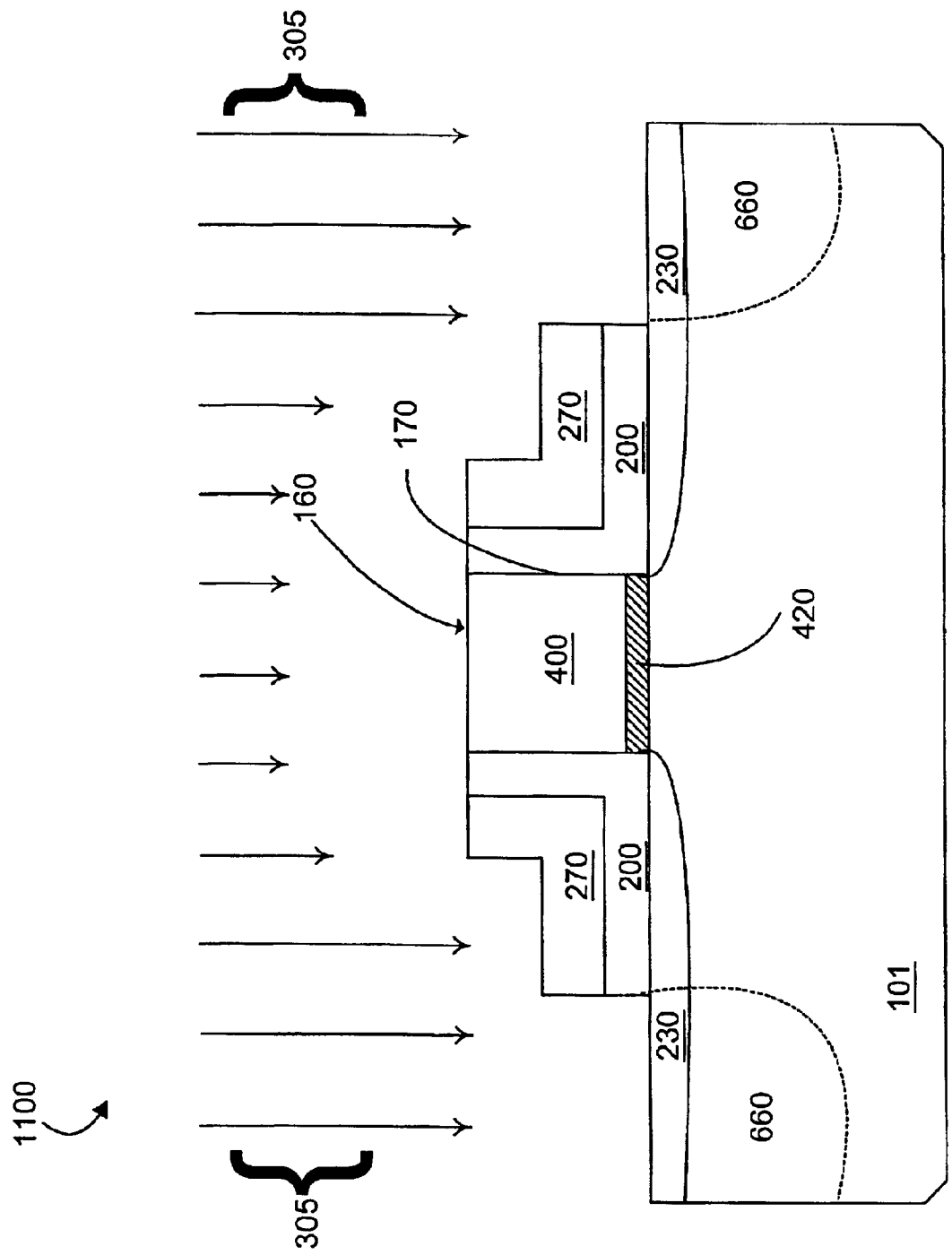

FIG. 16 is a cross-sectional view illustrating the formation deeply formed by doping source/drain regions 660 within portions of the substrate 101 adjacent to the spacers 270. Doped regions 660 are created by ion implantation 305 and is commonly known to those skilled in the art.

Figure 17:
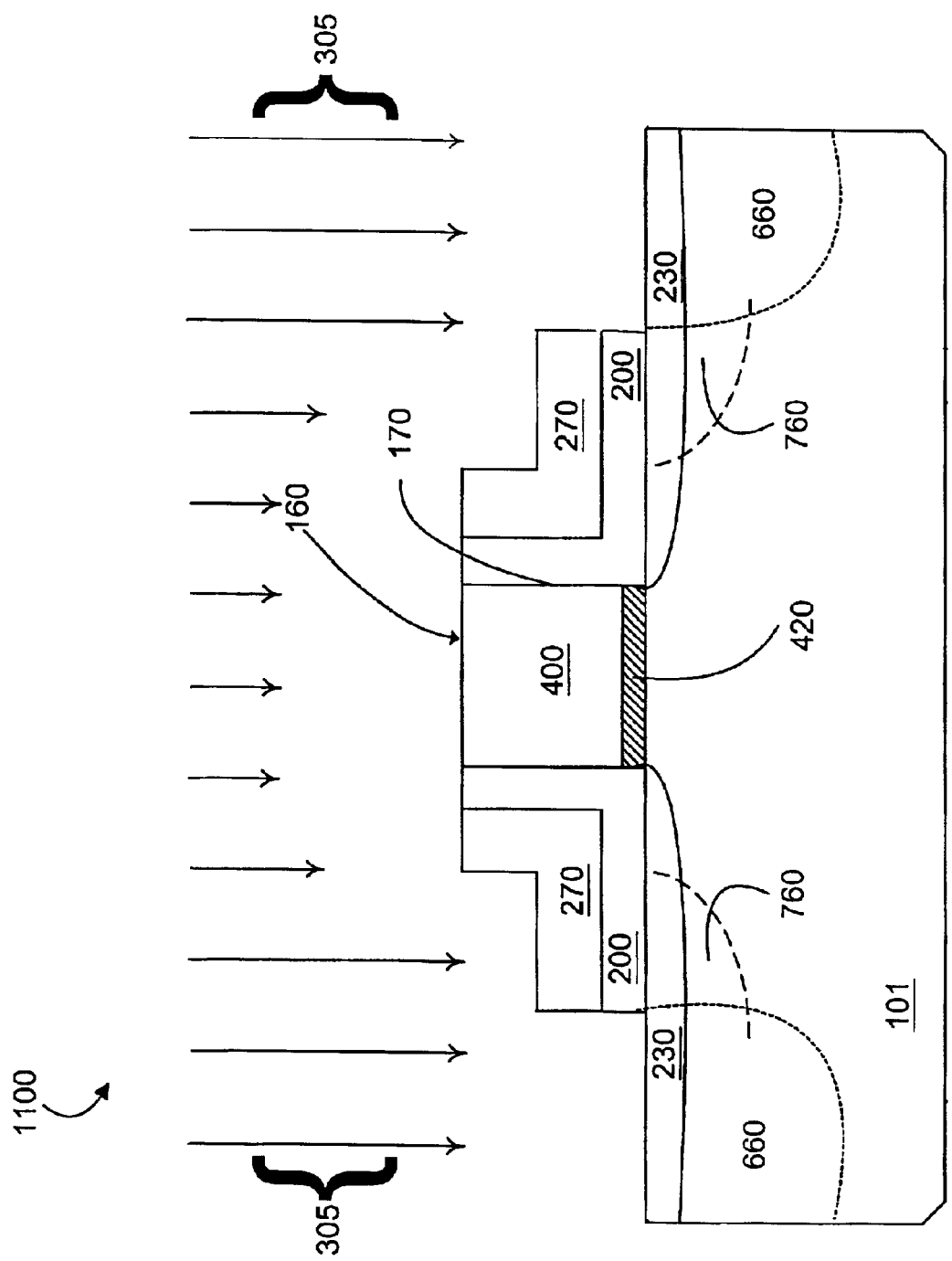

In FIG. 17, substrate 101 is doped by ion implantation 305 to form intermediate doped regions 760 and deeply formed source/drain regions 660. In an embodiment, the intermediate doped regions 760 are intermediate source/drain regions formed by doping the substrate 101, wherein the dopants are implanted through the substrate portion of the spacer 270. The formation of intermediate doped regions 760 is a function of both the thickness of the lower portion of the L-shaped spacer and the energy of the implanted ions (implant power). By way of example, the substrate portion of the L-shaped spacer 270 comprise a thickness within the range of approximately 150 to 500 angstroms and the underlying liner oxide layer 200 includes a thickness within the range of approximately 50 and 300 angstroms. For this assorted embodiment, possible implant species for a PMOS are Boron (B), Indium (In) and Boron diflouride ($BF_2$). In particular, to implant Boron with an ion dose within the range of $1e13/cm^2$ and $1e15/cm^2$, the ion energy applied is a value within the range of about 5 keV and 15 keV. Possible implant species for an NMOS are Arsenic (As), Phosphorous (Ph) and Antimony (Sb). Similarly, to implant Arsenic with an ion dose within the range of $1e13/cm^2$ and $1e15/cm^2$, the ion energy applied is a value within the range of about 10 keV and 100 keV.

The intermediate doped regions 760 is not formed as deeply into the substrate 101 as the deeply formed source/drain regions 660, since the L-shaped spacer resides over the intermediate doped regions 760.

In the described embodiments, the depth of the intermediate doped regions 760 can be a value within the range of approximately 50 angstroms to 500 angstroms, while the source/drain region 660 will have a greater depth, generally in the range of 300 to 1000 Angstroms or greater. In another embodiment in which the ion energies are at the lower end of its range and/or the thickness of the oxide and nitride layers are at the upper end of its range, the ion does not penetrate through the substrate portion of the spacer 270 to the silicon. In particular, the deeply formed source/drain regions 660 have an average depth that is greater than the average depth of the intermediate source/drain region 760. Likewise, the intermediate source/drain region 760 has an average depth that is greater than the source/drain extension region 230.

Figure 18:
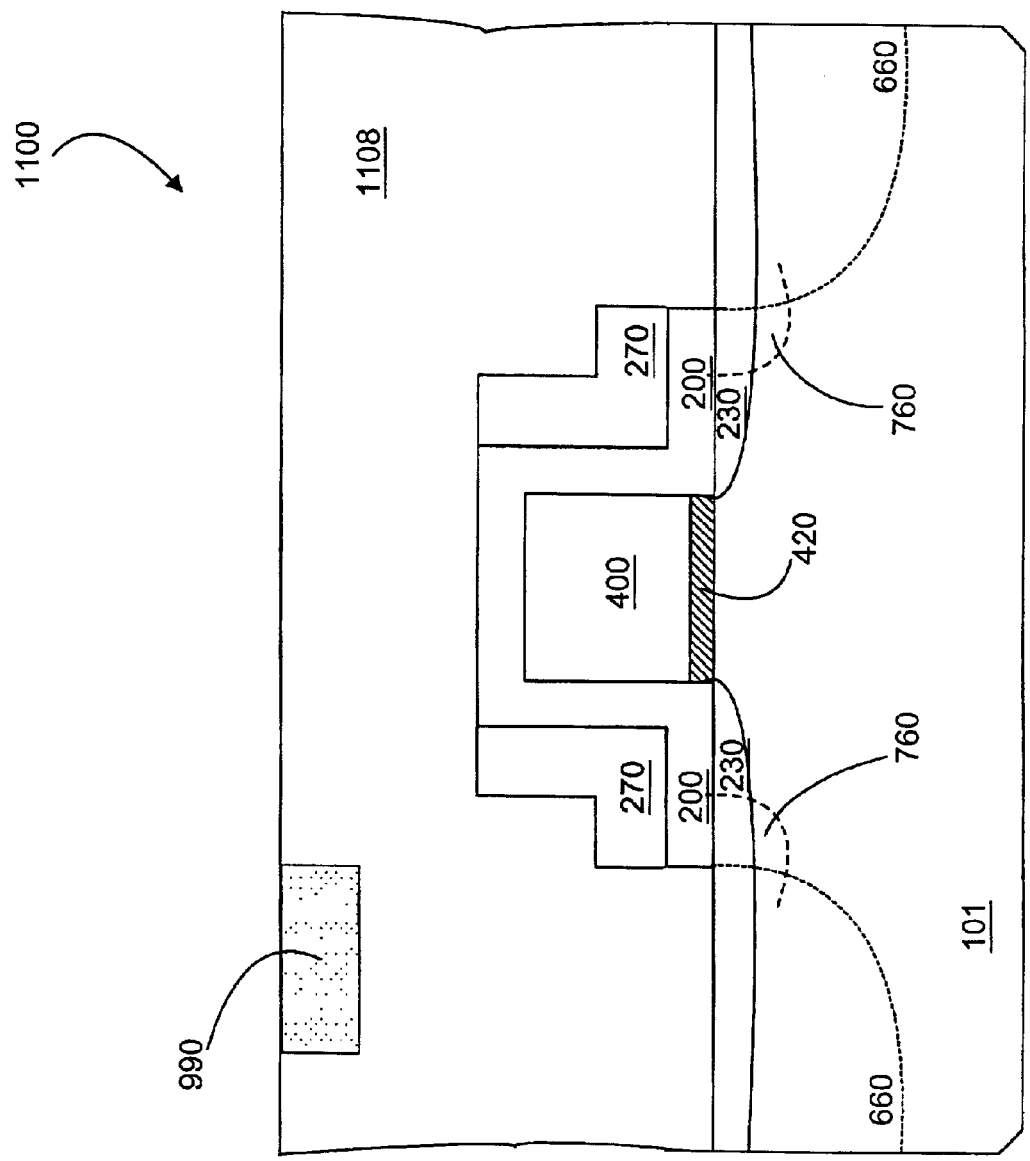

FIG. 18 is a cross-sectional view of a substantially completed transistor 1100 according to an embodiment of the present disclosure. A pre-metal dielectric layer 1108 is applied over the partially formed transistor device 1100 of FIG. 17. In one embodiment, the pre-metal dielectric layer 1108 may be comprised of a composite layer (not illustrated). A metal structure 990 has been formed over a portion of the pre-metal dielectric layer 1108. Formation of metal structures, such as metal structure 990, can be performed using any appropriate process as would be readily known in the art. While metal structure 990 is illustrated as an inlaid structure, it will be appreciated that non-inlaid structures may be used as well.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims.

What is claimed is:

1. A method of fabricating a semiconductor transistor comprising the steps of:

providing a gate structure having a sidewall portion and a top portion, said gate structure formed on a substrate;

forming a dielectric spacer formed over the substrate, said dielectric spacer forming an L-shape comprising a vertical portion parallel to the sidewall portion, and a horizontal portion approximately orthogonal to the sidewall portion of the gate structure; forming a source/drain extension using a first implantation step, forming a first source/drain region in the substrate during a source/drain implant using an implant species in a second implantation step of indium, wherein the first source/drain region formed underneath the horizontal portion of the L-shaped dielectric spacer; and forming a second source/drain region in the substrate during the source/drain implant using the implant species, wherein the second source/drain region is immediately adjacent the first source/drain region and has a depth greater than a depth of the first source/drain region.

2. The method of claim 1, further including a step of forming a liner oxide over said gate structure prior to the step of forming the dielectric spacer.

3. The method of claim 1 wherein said L-shaped dielectric spacer is a nitride.

4. The method of claim 1 wherein the length of the horizontal portion of the L-shaped dielectric spacer ranges from about 200 Angstroms to about 500 angstroms.

5. A method of fabricating a semiconductor transistor comprising the steps of:

forming a source/drain extension having an average extension depth forming a first portion of a source/drain region underlying a horizontal midpoint location of a sidewall spacer of the semiconductor transistor, the first portion of the source/drain region having a first average depth and a first length; and forming a second portion of the source/drain region simultaneously in time with the first portion, wherein the second portion has a second average depth and a second length, wherein the second average depth is greater than the first average depth, and the first average depth is greater than the average extension depth.

6. The method of claim 5, wherein forming the first portion further comprises the horizontal midpoint location being at a horizontal portion of an L-shaped sidewall spacer, the horizontal portion being approximately orthogonal a sidewall portion of a gate of the semiconductor transistor.

7. The method of claim 5, wherein the first length is substantially equal to a length of the horizontal portion of the L-shaped sidewall spacer.

8. A method of fabricating a semiconductor transistor comprising the steps of:

providing a gate structure having a sidewall portion and a top portion, said gate structure formed overlying a substrate;

forming a dielectric spacer formed overlying the substrate, said dielectric spacer forming an L-shape comprising a vertical portion parallel to the sidewall portion, and a horizontal portion approximately orthogonal to the sidewall portion of the gate structure;

forming a first source/drain region in the substrate during a source/drain implant, wherein the first source/drain region is formed by implanting a dopant through the horizontal portion of the L-shaped dielectric spacer; and forming a second source/drain region in the substrate during the source/drain implant using the implant species, wherein the second source/drain region is immediately adjacent the first source/drain region and has a depth greater than a depth of the first source/drain region, wherein forming the second source/drain and the first source/drain occurs simultaneously.

9. The method of claim 5, wherein forming the first portion comprises implanting a dopant in the first portion through the sidewall spacer; and forming the second portion comprises implanting the dopant in the second portion simultaneously with implanting the dopant in the first portion.

* * * * *